(12) United States Patent
Chen et al.

(10) Patent No.: US 6,780,788 B2
(45) Date of Patent: Aug. 24, 2004

(54) METHODS FOR IMPROVING WITHIN-WAFER UNIFORMITY OF GATE OXIDE

(75) Inventors: Chi-Chun Chen, Kaohsiung (TW); Ming-Fang Wang, Taichung (TW); Shih-Chang Chen, Taoyuan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 3 days.

(21) Appl. No.: 10/214,251

(22) Filed: Aug. 7, 2002

(65) Prior Publication Data

US 2004/0058497 A1 Mar. 25, 2004

(51) Int. Cl.$^7$ ............................................. H01L 21/31
(52) U.S. Cl. ....................................... 438/758; 438/761
(58) Field of Search .................................. 438/758, 761

(56) References Cited

U.S. PATENT DOCUMENTS 5,262,336 A * 11/1993 Pike et al. .................. 438/138
5,834,840 A * 11/1998 Robbins et al. ............. 257/705
6,001,731 A * 12/1999 Su et al. ..................... 438/633

* cited by examiner

Primary Examiner—John F. Niebling
Assistant Examiner—Olivia T. Luk
(74) Attorney, Agent, or Firm—Tung & Associates

(57) ABSTRACT

Novel methods for improving the within-wafer uniformity of a gate oxide layer on a semiconductor wafer substrate. According to a first embodiment, a gate oxide layer is formed on a wafer using conventional oxidation parameters and equipment. Next, the edge-thick gate oxide layer is nitridated using a center-thick plasma nitridation profile to enhance uniformity in thickness of the gate oxide layer between the center region and the edge or peripheral regions of the wafer. According to a second embodiment, the wafer substrate is first nitridated and then oxidized to form the gate oxide layer. The nitrogen incorporated into the wafer surface during the nitridation step retards oxidation of the wafer at the wafer edge to enhance uniformity in thickness of the gate oxide layer between the center region and the edge or peripheral regions of the wafer.

20 Claims, 2 Drawing Sheets

METHODS FOR IMPROVING WITHIN-WAFER UNIFORMITY OF GATE OXIDE

FIELD OF THE INVENTION

The present invention relates to processes for forming gate oxides on semiconductor wafer substrates. More particularly, the present invention relates to methods for improving the within-wafer thickness uniformity of a gate oxide layer on a semiconductor wafer.

BACKGROUND OF THE INVENTION

In the semiconductor fabrication industry, silicon oxide ($SiO_2$) is frequently used for its insulating properties as a gate oxide or dielectric. As the dimensions of device circuits on substrates become increasingly smaller, the gate dielectric thickness must decrease proportionately in field effect transistors (FETs) to approximately 3 to 3.5 nonometers. Accordingly, device performance and reliability can be adversely affected by such factors as interfacial defects, defect precursors and diffusion of dopants through gate dielectrics, as well as unintended variations in thickness in the gate oxide layer among central and peripheral regions of the layer.

A current drive in the semiconductor device industry is to produce semiconductors having an increasingly large density of integrated circuits which are ever-decreasing in size. These goals are achieved by scaling down the size of the circuit features in both the lateral and vertical dimensions. Vertical downscaling requires that the thickness of gate oxides on the wafer be reduced by a degree which corresponds to shrinkage of the circuit features in the lateral dimension. While there are still circumstances in which thicker gate dielectrics on a wafer are useful, such as to maintain operating voltage compatibility between the device circuits manufactured on a wafer and the current packaged integrated circuits which operate at a standard voltage, ultrathin gate dielectrics will become increasingly essential for the fabrication of semiconductor integrated circuits in the burgeoning small/fast device technology.

Because it is strongly correlated with gate oxide integrity, uniformity in thickness among all regions of the gate oxide layer is a major challenge and concern in ultrathin gate oxide fabrication. In a conventional oxidation process, wafers are heated in a furnace using heat furnished by a heater positioned outside the furnace. As a result, the wafers are heated from the edge to the center of the wafer, and the temperature of the wafer edge is thus always higher than the temperature at the wafer center. Hence, the oxidation rate is higher at the wafer edge than at the wafer center, and this temperature disparity is the main cause of oxide thickness non-uniformity within the wafer. This effect is illustrated in FIG. 1, which indicates the relative gate oxide thickness between the peripheral or edge region 12 of a semiconductor wafer 10 and the center region 14 of the wafer 10 after a gate oxide deposition process. In FIG. 1, the mottled appearance indicates areas of greater oxidation thickness in the peripheral region 12 of the wafer 10 relative to the lower oxidation thickness indicated by the non-mottled appearance in the more central region 14 of the wafer 10. This disparity in oxide thickness between peripheral and central regions of the wafer may be as large as two angstroms, is typical of results obtained after using both horizontal and vertical type furnaces, and is exacerbated as the size of the wafer increases from 200 mm to 300 mm. As oxide thickness scales down to direct-tunneling regime (i.e., Tox<3 nm), this effect renders the process control non-tolerable.

Plasma nitridation is a new and promising technique used to improve oxide reliability as well as reduce gate leakage current. U.S. Pat. No. 6,225,169 details a method of constructing a gate dielectric on a semiconductor surface including cleaning a silicon surface then growing a silicon nitride barrier layer on the silicon surface using a high density plasma (HDP) of nitrogen. A gate dielectric layer is then deposited on the silicon nitride layer and a second silicon nitride layer is then grown on the dielectric layer, also using an HDP nitrogen plasma, followed by deposition of the conductive gate layer. The HDP nitrogen plasma is heated using an inductively coupled ratio frequency generator. The invention also includes a gated device including a gate dielectric constructed on a semiconductor surface by the method of the invention.

U.S. Pat. No. 6,110,842 describes a method for forming integrated circuits having multiple gate oxide thicknesses. A high density plasma is used for selective plasma nitridation to reduce the effective gate dielectric thickness in selected areas only. In one embodiment, a pattern is formed over a substrate and a high density plasma nitridation is used to form a thin nitride or oxynitride layer on the surface of the substrate. The pattern is removed and oxidation takes place. The nitride or oxynitride layer retards oxidation, whereas in the areas where the nitride or oxynitride layer is not present, oxidation is not retarded. In another embodiment, a thermal oxide is grown. A pattern is then placed that exposes areas where a thinner effective gate oxide is desired. The high density plasma nitridation is performed converting a portion of the gate oxide to nitride or oxynitride. The effective thickness of the combined gate dielectric is reduced.

SUMMARY OF THE INVENTION

The present invention includes two novel methods for improving gate oxide uniformity and reliability in ultrathin gate oxide processing. Both approaches take advantage of plasma nitridation, an effective treatment to incorporate nitrogen into ultrathin oxide for leakage current and EOT reduction. It is well-known that furnace oxidation results in an edge-thick oxidation profile due to heating of the wafer from edge to center. According to a first embodiment of the present invention, a gate oxide layer is formed on a wafer substrate using a conventional oxidizing process typically in a batch-type furnace. The resulting edge-thick oxidized wafer is then nitridized using a plasma nitridation process. By intentionally tuning the nitridation profile as center-thick, final within-wafer uniformity can be vastly improved.

According to a second embodiment of the present invention, the wafer surface is first nitridized by plasma nitridation and then oxidized to form the gate oxide in an oxidation furnace. As in the Nitrogen-Implanted Silicon Substrate (NISS) technique, nitrogen is incorporated into the gate oxide, thereby reducing the oxidation rate. By intentionally incorporating a higher quantity of nitrogen into the wafer edge, the oxidation rate at the wafer edge can be suppressed and compensate for the edge-thick characteristic normally resulting from furnace oxidation. The methods of the present invention are particularly beneficial in the formation of uniform gate oxides on 300 mm wafers, since it is conventionally more difficult to control within-wafer uniformity of ultrathin oxides on 300 mm wafers.

An object of the present invention is to provide novel methods for improving within-wafer uniformity of a gate oxide on a substrate.

Another object of the present invention is to provide novel methods for improving the integrity of a gate oxide layer on a substrate.

Still another object of the present invention is to provide novel methods which compensate for edge-thick oxidation of semiconductor wafers due to non-uniform heating of the wafers in the gate oxidation process.

Yet another object of the present invention is to provide novel methods which utilize plasma nitridation to improve within-wafer uniformity of a gate oxide layer on a semiconductor wafer substrate.

A still further object of the present invention is to provide a method including formation of a gate oxide layer on a wafer substrate followed by nitridation of the gate oxide layer to compensate for an edge-thick oxide gate profile obtained during the oxidation process.

Still another object of the present invention is to provide a novel method in which plasma nitridation is used to intentionally tune a center-thick nitridation profile to compensate for an edge-thick gate oxide previously deposited on the wafer and facilitate enhanced within-wafer uniformity of the gate oxide on the wafer.

Yet another object of the present invention is to provide a method which includes nitridation of a wafer surface followed by oxidation of the wafer to provide a substantially uniform within- wafer gate oxide profile throughout all regions of the wafer.

Another object of the present invention is to provide a method for improving within-wafer uniformity of a gate oxide layer on a semiconductor wafer substrate, which method includes nitridation followed by oxidation of the wafer surface, wherein nitrogen initially incorporated into the wafer surface attenuates oxidation at the wafer edges and therefore prevents excessive gate oxide thickness at the edges relative to the gate oxide thickness at the center of the wafer.

In accordance with these and other objects and advantages, the present invention comprises novel methods for improving the within-wafer uniformity of a gate oxide layer on a semiconductor wafer substrate. According to a first embodiment, a gate oxide layer is formed on a wafer using conventional oxidation parameters and equipment. Next, the edge-thick gate oxide layer is nitridated using a center-thick plasma nitridation profile to enhance uniformity in thickness of the gate oxide layer between the center region and the edge or peripheral regions of the wafer. According to a second embodiment, the wafer substrate is first nitridated and then oxidized to form the gate oxide layer. The nitrogen incorporated into the wafer surface during the nitridation step retards oxidation of the wafer at the wafer edge to enhance uniformity in thickness of the gate oxide layer between the center region and the edge or peripheral regions of the wafer.

BRIEF DESCRIPTION OF THE DRAWINGS

The invention will now be described, by way of example, with reference to the accompanying drawings, in which.

DESCRIPTION OF THE PREFERRED EMBODIMENTS

Figure 3:
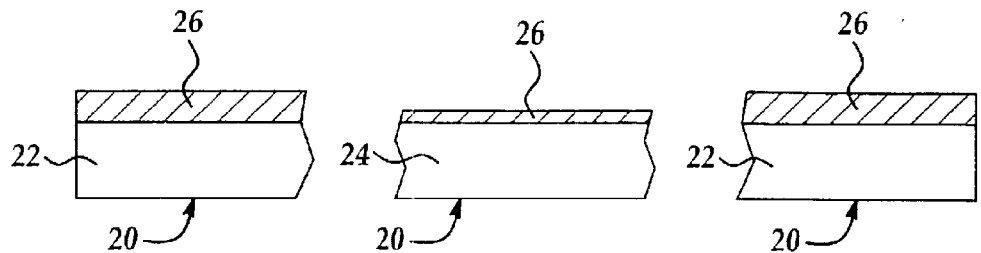
FIG. 3 illustrates edge and center regions of a semiconductor wafer substrate, in section, with an oxide layer deposited on the substrate in a first step of a first embodiment of the present invention.
Figure 4:
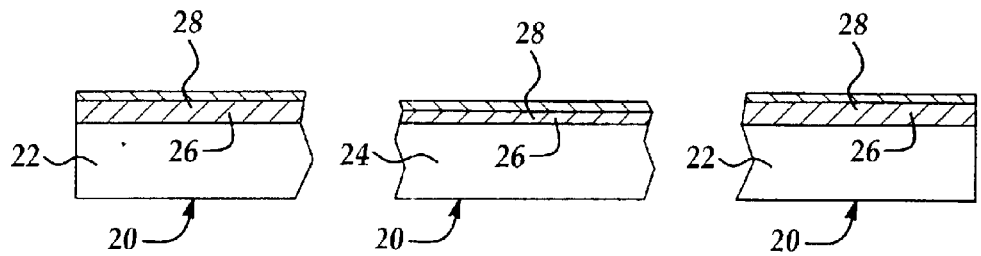
FIG. 4 illustrates edge and center regions of a semiconductor wafer substrate, in section, with a nitride layer deposited on the oxide layer in a second step of a first embodiment of the present invention.

Referring initially to FIGS. 3 and 4, according to a first embodiment of the novel method of the present invention, a $SiO_2$ gate oxide layer 26 is initially formed on a substrate 20 typically using a conventional batch-type furnace using oxidation process parameters which are known by those skilled in the art. While a silicon substrate or silicon epitaxial layer is typically used for the substrate 20, other substrates may alternatively be used. The substrate 20 may have undergone several processing steps, such as, for example, formation of isolation structures as well as various implants such as threshold control implants. From a consideration of FIG. 3, it can be seen that the thickness of the gate oxide layer 26 deposited at the peripheral or edge regions 22 on the substrate 20 is greater than the thickness of the gate oxide layer 26 at the central region 24 of the substrate 20. This disparity in thickness may be 2 angstroms or greater and is due to higher reaction temperatures at the edge region 22 than at the central region 24 of the substrate 20 during the oxidation process.

After the gate oxide layer 26 has been deposited on the substrate 20, a plasma nitridation process is used to deposit a nitride or oxynitride layer 28 on the gate oxide layer 26. Such a plasma nitridation process may be carried out for example in a remote plasma nitridation (RPN) chamber which is obtainable from the Applied Materials Corp. of Santa Clara, Calif. The nitrogen source for the plasma nitridation process may be any nitrogen-containing precursor such as $N_2$, $NH_3$, or any mixture of those gases, with an inert gas such as He. Preferably, the nitrogen-containing gas is present in the nitridation gas mixture in a ratio of about 10% nitrogen gas and about 90% He. The nitridation plasma may be a high density plasma and may be generated from a source such as helicon, helical resonator, electron-cyclotron resonance, or inductive coupling, in non-exclusive particular. The substrate 20 may be unbiased, in which case ions from the plasma are accelerated by the plasma potential (about 20 volts) and driven into the surface of the gate oxide layer 26. Alternatively, the substrate 20 may be biased to provide a greater ion voltage potential and accelerate plasma ions deeper into the gate oxide layer 26. The nitridation step may be effectively implemented using the following process parameters: power between 800–850 watts; nitrogen flow between about 1–2000 sccm (preferably about 1–50 sccm); pressure between about 1–300 Torr (preferably about 1–50 Torr); and a duration in the range of about 10–100 sec.

Figure 1:
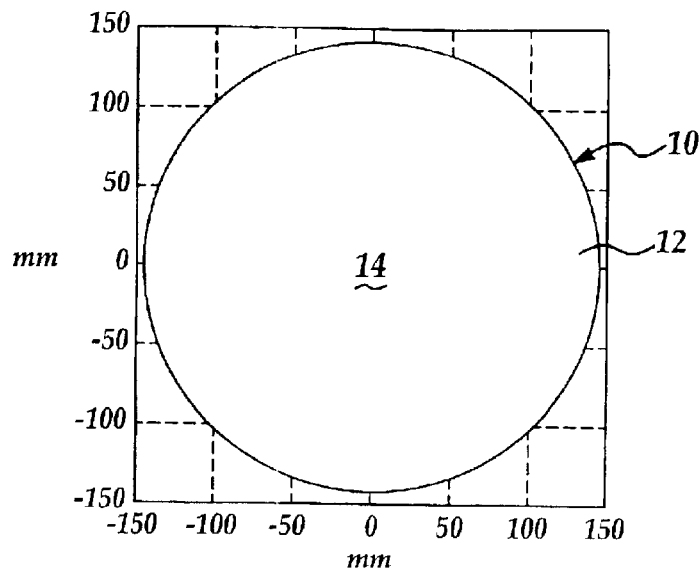
FIG. 1 illustrates a typical edge-thick profile of an ultra-thin gate oxide layer deposited on a wafer substrate using conventional oxidation equipment and parameters.
Figure 2:
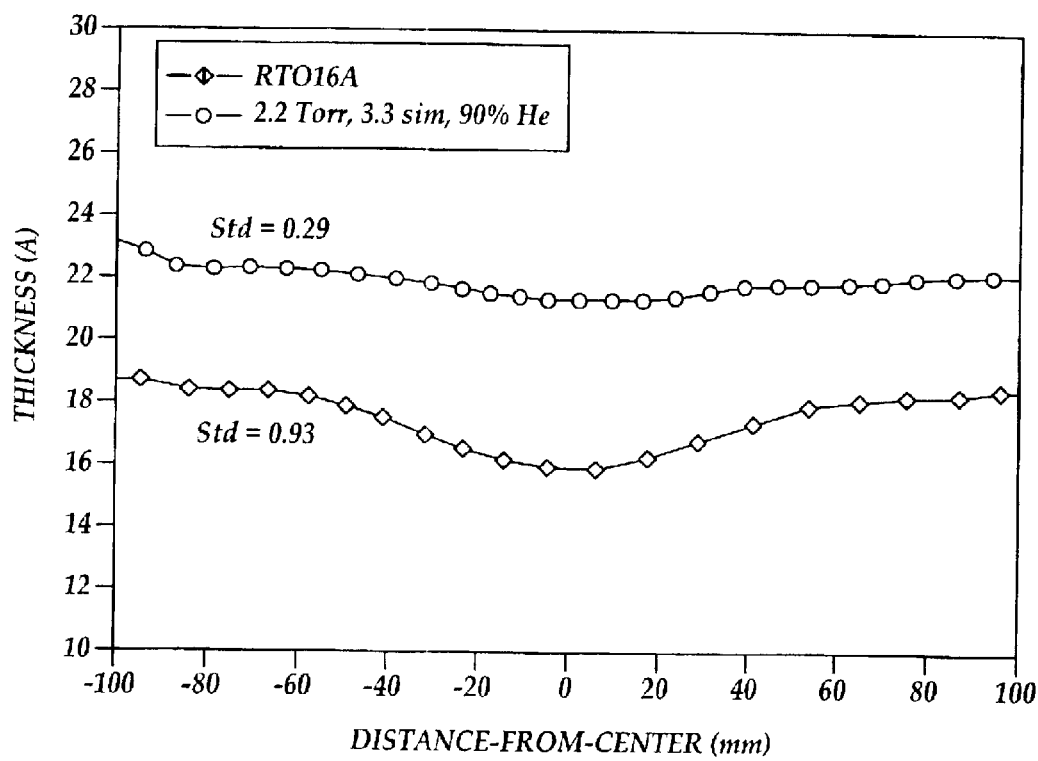
FIG. 2 illustrates a thickness profile of a gate oxide layer formed as a result of a conventional oxidation process as compared to the thickness profile of a gate oxide layer formed as a result of a method of the present invention.

As illustrated in FIG. 4, the foregoing nitridation process forms a nitride or oxynitride layer 28 on the oxide layer 26, which nitride or oxynitride layer 28 substantially reduces the disparity in the overall thickness of the gate oxide or dielectric layer between the edge region 22 and the center region 24 of the substrate 20. Accordingly, the gate oxide or dielectric layer is substantially the same in thickness throughout all regions on the substrate 20. This is corroborated by the graph in FIG. 2, in which thickness of the gate oxide or dielectric layer is plotted as a function of the location from the center to the edges of the substrate. In the graph, the thickness of the oxide layer resulting from the oxidation process alone is shown by the connected triangles, whereas the thickness of the gate oxide layer is shown by the connected circles. Process parameters for the graphed nitridation process were as follows: gas flow 3.3 sccm; gas flow mixture 10% nitrogen and 90% helium; pressure 2.2 Torr; and a duration of 30 sec. From a consideration of the graph, it can be seen that uniformity in thickness of the gate oxide layer between the edge and center regions of the substrate was substantially improved by the nitridation process.

Figure 5:
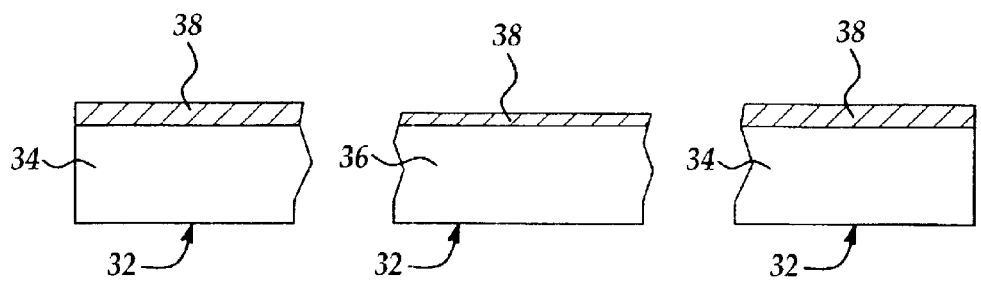
FIG. 5 illustrates edge and center regions of a semiconductor wafer substrate, in section, with a nitride layer deposited on the substrate in a first step of a second embodiment of the present invention.
Figure 6:
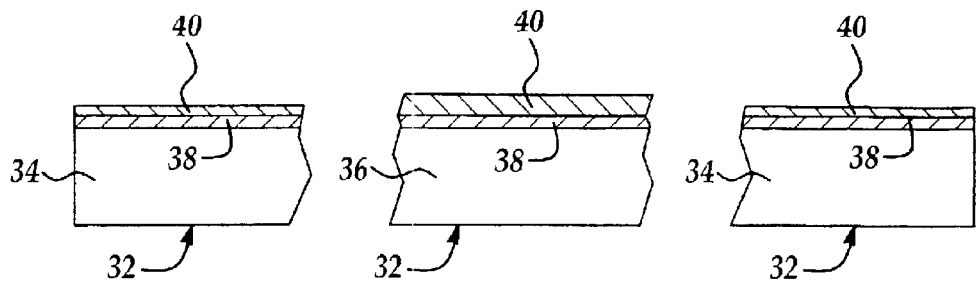
FIG. 6 illustrates edge and center regions of a semiconductor wafer substrate, in section, with an oxide layer deposited on the nitride layer in a second step of a second embodiment of the present invention.

Referring next to FIGS. 5 and 6, according to a second embodiment of the novel method of the present invention, a nitride or oxynitride layer 38 is initially formed on a substrate 32. While the substrate 32 is typically a silicon substrate or silicon epitaxial layer, other substrates may alternatively be used. The substrate 32 may have undergone several processing steps, such as, for example, formation of isolation structures as well as various implants such as threshold control implants, in non-exclusive particular. The plasma nitridation process used to deposit the nitride or oxynitride layer 38 on the substrate 32 may be carried out in a remote plasma nitridation (RPN) chamber which is obtainable from the Applied Materials Corp. of Santa Clara, Calif. The nitrogen source for the plasma nitridation process may be any nitrogen-containing precursor such as $N_2$, NH3 or any mixture of those gases with an inert gas such as He. Preferably, the nitrogen-containing gas is present in the nitridation gas mixture in a ratio of about 10% nitrogen gas and about 90% He. The nitridation plasma may be a high density plasma and may be generated from a source such as helicon, helical resonator, electron-cyclotron resonance, or inductive coupling, in non-exclusive particular. The substrate 32 may be unbiased, in which case ions from the nitridation plasma are accelerated by the plasma potential (typically about 20 volts) and driven into the surface of the substrate 32. Alternatively, the substrate 32 may be biased to provide a greater ion voltage potential which accelerates plasma ions deeper into the substrate 32. The nitridation step may be effectively implemented using the following process parameters: power between 800–850 watts; nitrogen flow between about 1–2000 sccm (preferably about 1–50 sccm); pressure between about 1–300 Torr (preferably about 1–50 Torr); and a duration in the range of about 10–100 sec.

As illustrated in FIG. 5, the foregoing nitridation process forms a nitride or oxynitride layer 38 which is relatively thicker at the edge regions 34 than in the center region 36 on the substrate 32. As a second step in the process, a $SiO_2$ gate oxide layer 40 is then formed on the nitride or oxynitride layer 38 typically using conventional oxidizing process parameters which are known by those skilled in the art. During the oxidation process, nitrogen from the nitride or oxynitride layer 38 is incorporated into the overlying gate oxide layer 40. Due the relatively larger quantity or thickness of the nitride or oxynitride layer 38 at the edge region 34 as compared to the center region 36, the oxidation rate at the edge region 34 of the substrate 32 is retarded with respect to the oxidation rate at the center region 36. As a result, the oxide layer 40 is thinner than the nitride or oxynitride layer 38 at the edge region 34 than at the center region 36. consequently, because the nitride or oxynitride layer 38 previously deposited onto the substrate 32 was thicker at the edge region 34 than at the center region 36, the gate oxide or dielectric layer is substantially the same in thickness throughout all regions on the substrate 32.

Table I below illustrates the thickness profile of a nitride or oxynitride layer deposited alone on a substrate, an oxide layer deposited alone on a substrate, and a nitride or oxynitride layer which is deposited on a substrate and on which is deposited an oxide layer, as in the present invention.

TABLE I

| Recipe | Thk | Min. | Max. | NU (%) | Note |
|---|---|---|---|---|---|
| Nitride (RPN10s) | 9.765 | 9.12 | 9.857 | 2.58% | Center Thick |
| Oxide (RPO30s) | 18.783 | 18.49 | 19.035 | 1.67% | Edge Thick |
| Nitride (RPN10s) + Oxide (RPO30s) | 16.074 | 15.921 | 16.212 | 0.48% | |

From a consideration of Table I, it can be seen that the percentage of non-uniformity (NU) between the center and the edge of a nitride or oxynitride layer deposited on a wafer substrate alone is 2.58%, whereas the NU percentage of an oxide layer is 1.67%. The NU percentage when a nitride or oxynitride layer is deposited on the substrate followed by deposition of an oxide layer, according to the second embodiment of the present invention, is only 0.48%, which represents a substantial improvement of within-wafer uniformity.

While the preferred embodiments of the invention have been described above, it will be recognized and understood that modifications can be made in the invention and the appended claims are intended to cover all such modifications which may fall within the spirit and scope of the invention.

Having described our invention with the particularity set forth above,

What is claimed is:

1. A method of forming a composite gate dielectric layer, comprising the steps of:
   providing a substrate;
   providing an oxide layer having an oxide thickness profile on said substrate, said oxide layer having an upper surface; and
   providing a nitride layer having a nitride thickness profile on said upper surface of said oxide layer, wherein said nitride thickness profile of said nitride layer compensates said oxide thickness profile of said oxide layer to impart a substantially uniform thickness profile to said composite gate dielectric layer.

2. The method of claim 1 wherein said oxide layer is formed by a furnace process.

3. The method of claim 1 wherein said nitride layer is formed by a plasma process.

4. The method of claim 3 wherein said oxide layer is formed by a furnace process.

5. The method of claim 1 wherein said oxide thickness profile comprises areas of greater oxide thickness in peripheral regions of the substrate and areas of lesser oxide thickness in a center region of the substrate.

6. The method of claim 5 wherein said oxide layer is formed by a furnace process.

7. The method of claim 5 wherein said nitride layer is formed by a plasma process.

8. The method of claim 7 wherein said oxide layer is formed by a furnace process.

9. A method of forming a composite gate dielectric layer, comprising the steps of:

providing a substrate;

providing an oxide layer having an upper surface and a substantially nonuniform oxide thickness profile on said substrate; and providing a nitride layer on said upper surface of said oxide layer, said nitride layer having areas of greater nitride thickness in a center region of said substrate and areas of lesser nitride thickness in peripheral regions of said substrate, wherein said nitride layer compensates said oxide thickness profile of said oxide layer to impart a substantially uniform thickness profile to said composite gate dielectric layer.

10. The method of claim 9 wherein said oxide layer is formed by a furnace process.

11. The method of claim 9 wherein said nitride layer is formed by a plasma process.

12. The method of claim 11 wherein said oxide layer is formed by a furnace process.

13. The method of claim 9 wherein said oxide thickness profile comprises areas of greater oxide thickness in said peripheral regions of said substrate and areas of lesser oxide thickness in said center region of said substrate.

14. The method of claim 13 wherein said oxide layer is formed by a furnace process.

15. The method of claim 14 wherein said nitride layer is formed by a plasma process.

16. The method of claim 15 wherein said oxide layer is formed by a furnace process.

17. A method of forming a composite gate dielectric layer, comprising the steps of:

providing a substrate;

providing a nitride layer having a nitride thickness profile on said substrate; and providing an oxide layer having an oxide thickness profile on said nitride layer, wherein said oxide thickness profile of said oxide layer compensates said nitride thickness profile of said nitride layer to impart a substantially uniform thickness profile to said composite gate dielectric layer.

18. The method of claim 17 wherein said oxide layer is formed by a furnace process.

19. The method of claim 17 wherein said nitrate layer is formed by a plasma process.

20. The method of claim 17 wherein said nitrate thickness profile comprises areas of greater nitride thickness at peripheral regions of said substrate and areas of lesser nitride thickness at a center region of said substrate, and wherein said oxide thickness profile comprises areas of lesser oxide thickness at said peripheral regions of said substrate and areas of greater oxide thickness at a center region of said substrate.

* * * * *